United States Patent [19]

Dumoulin

[11] Patent Number: 5,446,384

[45] Date of Patent: Aug. 29, 1995

[54] SIMULTANEOUS IMAGING OF MULTIPLE SPECTROSCOPIC COMPONENTS WITH MAGNETIC RESONANCE

[75] Inventor: Charles L. Dumoulin, Ballston Lake, N.Y.

[73] Assignee: General Electric Company, Schenectady, N.Y.

[21] Appl. No.: 173,021

[22] Filed: Dec. 27, 1993

[51] Int. Cl.$^6$ .................................................. G01R 33/48
[52] U.S. Cl. ................................... 324/307; 324/309
[58] Field of Search ............ 324/300, 307, 309, 314, 324/311, 310

[56] References Cited

U.S. PATENT DOCUMENTS

| | | | |
|---|---|---|---|
| 5,093,619 | 3/1992 | Hennig | 324/309 |
| 5,225,781 | 7/1993 | Glover et al. | 324/309 |
| 5,233,298 | 8/1993 | Dumoulin | 324/306 |
| 5,250,899 | 10/1993 | Listerud | 324/309 |
| 5,298,862 | 3/1994 | Hennig | 324/309 |
| 5,347,217 | 9/1994 | Leach et al. | 324/307 |

OTHER PUBLICATIONS

"Simple Proton Spectroscopic Imaging", Radiology, vol. 153, pp. 189–194, 1984.

Primary Examiner—Sandra L. O'Shea
Assistant Examiner—Raymond Y. Mah
Attorney, Agent, or Firm—Lawrence P. Zale; Marvin Snyder

[57] ABSTRACT

Magnetic resonance images of selected chemical species are generated by the application of a multi-band radio-frequency excitation pulse. The radio-frequency pulse excites an arbitrary number of spectral bands. As the imaging phase encoding gradient pulse is advanced, the phase of each excitation band is advanced by a unique amount. This causes the signals from the spins in a particular band to appear at a position in the phase encoding direction which is the stem of the spin position and an offset arising from the phase increment given to that excitation band. Additional selectivity of selected chemical species can be accomplished by combining the multi-band excitation with chemical shift selective saturation radio-frequency pulses and echo-time modulation.

5 Claims, 7 Drawing Sheets

SIMULTANEOUS IMAGING OF MULTIPLE SPECTROSCOPIC COMPONENTS WITH MAGNETIC RESONANCE

BACKGROUND OF THE INVENTION

1. Field of the Invention

The present invention relates to the field of Magnetic Resonance Imaging and more specifically to the field of selective imaging of spectroscopic components with Magnetic Resonance.

2. Description of Related Art

The nucleus of an atom in a molecule of a material placed in a magnetic field will resonate when irritated with radiofrequency (RF) radiation of the proper frequency.

The nucleus will also produce a magnetic resonance (MR) response signal at the same resonant frequency. This resonant frequency, known as the 'Larmor' frequency, is a function of the applied magnetic field, the composition of the nucleus and other parameters. Different nuclei have different resonant frequencies, For example, in an applied magnetic field of 1.5 Tesla, silicon resonates at 12.7 MHz and hydrogen being at 63 MHz. Different nuclei, such as hydrogen and silicon may be differentiated by employing different RF radiation frequencies since they are far apart. This cannot be the case, however, with chemical species which are close on the frequency band.

The effects of the electron cloud of the molecule which the nucleus is a part, 'electron shielding', and the effects of neighboring molecules also affect the resonant frequency. These effects cause the resonant frequency to be slightly shifted from what it would be if they were not present, known as 'chemical shift'. These shifts may be on the order of a few Hertz to 100 kHz. Each chemical species creates a MR spectrum having peaks of increased amplitude at specific frequencies, characteristic of the species. Chemical species may be classified by a few of their substantial peaks. For example, in a 1.5 Tesla magnetic field, Hydrogen atoms in water have a resonant frequency at 63.8 MHz, whereas the Hydrogen atoms in lipids have a resonant frequency approximately 100 Hz higher.

A problem arises in imaging different chemical species of the same nuclei simultaneously. Since most MR imaging methods employ the use of a spatially changing magnetic field gradient to encode the location of a resonating nuclei, 'nuclear spins' or simply 'spins', to as a frequency change in an MR response signal which is detected. Fourier transforms then map each frequency to a location. This causes the slight differences in resonant frequency of the different chemical species to be lost. An MR response signal from a first chemical species will have the same frequency and mimic a MR response signal from a second chemical species at a different location. This also leads to artifacts if the resonant frequencies of both species within the frequency range caused by the magnetic field gradient.

Most of the protons which generate an MR signal in the body arise from water or lipids. Because water and lipids have different chemical shifts, MR signals from water and lipids, occur at slightly different Larmor frequencies and theoretically can be separated.

Several methods have been previously disclosed for the simultaneous detection of two or more chemical species in a magnetic resonance image. One method, known as chemical shift imaging, requires the addition of a chemical shift dimension to a conventional two-dimensional magnetic resonance imaging procedure. This is accomplished by acquiring MR response signals at a series of uniformly incremented echo times. The frequency of each magnetic MR response signal is defined by the chemical shift of each chemical species. Since each chemical species has a unique MR response signal frequency, the phase evolution of transverse so spin magnetization the excitation, proceeds at a unique rate. The rate of phase evolution (i.e. the frequency) of each chemical species is determined by Fourier transforming the MR response signals.

W. Thomas Dixon has described in "Simple Proton Spectroscopic Imaging", *Radiology*, Vol. 153, p. 189–194 1984, a second method in which images are made of a selected spectral component. In this method, two images are acquired under identical conditions, except for the echo time which is chosen so that transverse spin magnetization from a selected chemical species has an additional phase shift. The complex difference between the acquired MR response signals is then, calculated. Resonances which have not acquired a substantial phase shift responsive to the additional echo time will be substantially cancelled upon subtraction. MR response signals which have acquired a $\phi$ phase shift, or greater, however, will add constructively upon subtraction.

Currently, imaging of different chemical species, such as silicone gel, is complicated by the fact that the signals acquired in conventional images have chemical shift artifacts and it is difficult to discriminate small amounts of gel from edema and healthy tissue. There is a need for a method of simultaneously imaging several chemical species clearly with MR imaging.

SUMMARY OF THE INVENTION

Magnetic resonance images of selected chemical species are generated by the application of a multi-band radio-frequency excitation pulse. The radio-frequency pulse excites an arbitrary number of spectral bands. As the imaging phase encoding gradient pulse is advanced, the phase of each excitation band is advanced by a unique amount. This causes the signals from the spins in a particular band to appear at a position in the phase encoding direction which is the sum of the spin position and an offset arising from the phase increment given to that excitation band. Additional selectivity of selected chemical species can be accomplished by combining the multi-band excitation with chemical shift selective saturation radio-frequency pulses and echo-time modulation.

OBJECTS Of THE INVENTION

It is an object of the present invention to provide a system for simultaneously obtaining magnetic resonance (MR) images from selected chemical species within a subject.

It is another object of the present invention to provide a system for obtaining MR images of desired chemical species with reduced artifacts.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
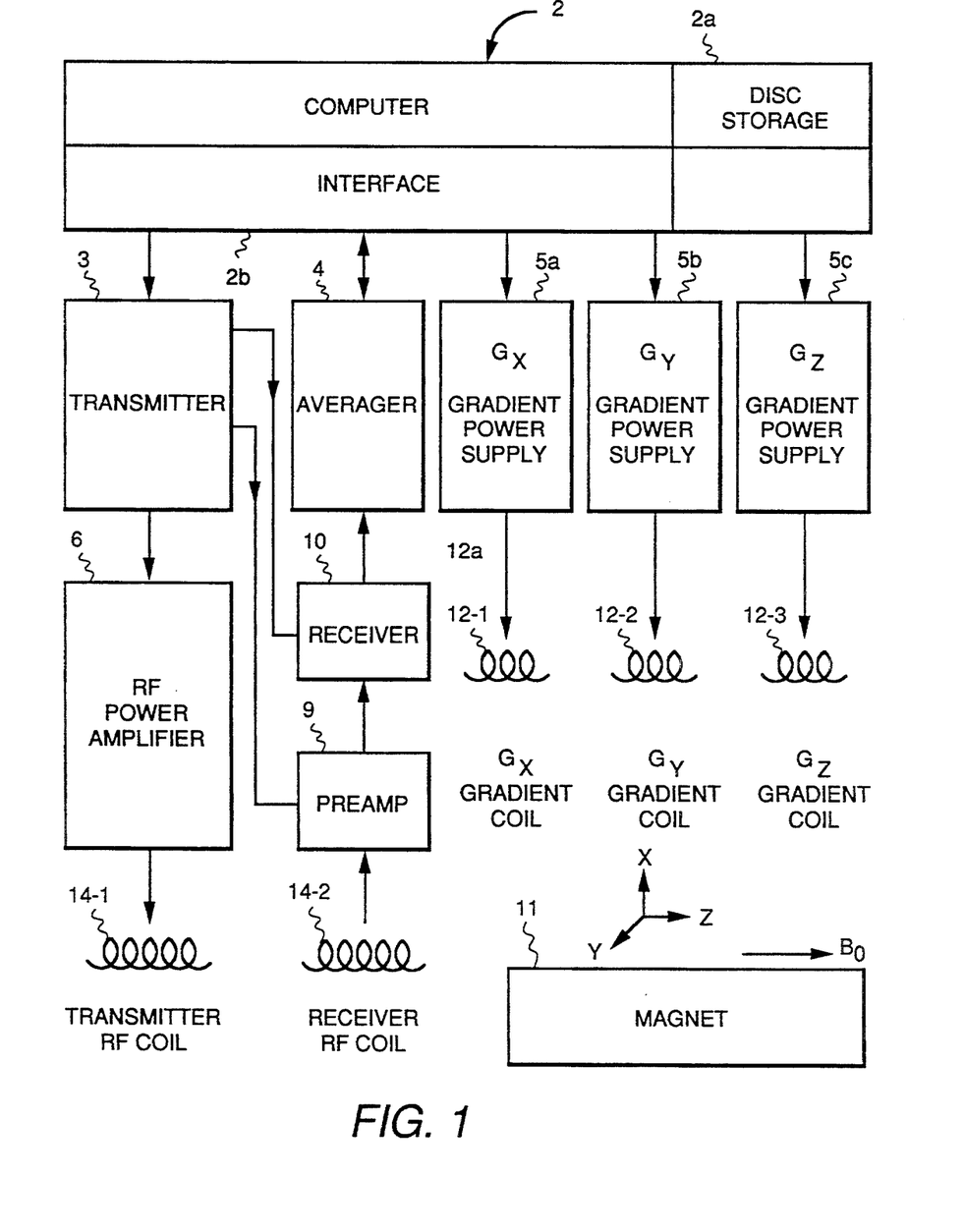
FIG. 1 is a simplified block diagram of a magnetic resonance (MR) imaging system suitable for use with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, respectively, in the "X", "Y", "Z" directions, respectively, over a subject to be imaged. RF transmitter 3 is gated with pulse envelopes from computer 2 to generate RF pulses having the required modulation to excite an MR response signal from a subject. The RF pules are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Magnetic field gradient coils 12-1, 12-2, and 12-3 are necessary to provide gradients $G_x$, $G_y$, and $G_z$, respectively, that are monotonic and linear over the sample volume. Multi-valued gradient fields cause a degradation in the MR response signal data, known as aliasing, which leads to severe image artifacts. Non-linear gradients cause geometric distortions of the image.

In the present invention a subject is placed in a substantially homogeneous magnetic field generated by the magnet 80 of FIG. 1 to cause nuclear spins to obtain longitudinal spin magnetization in manner well know to those skilled in the art of magnetic resonance imaging. Radio-frequency and magnetic field gradient pulses are then applied through transmitter RF coil 14-1 and $G_x$, $G_y$, $G_z$ gradient coils 12-1, 12-2 and 12-3, respectively, with MR response signals detected by receiver RF coil 14-2. At least one image arising from a selected chemical component within the subject is obtained.

Figure 2A:
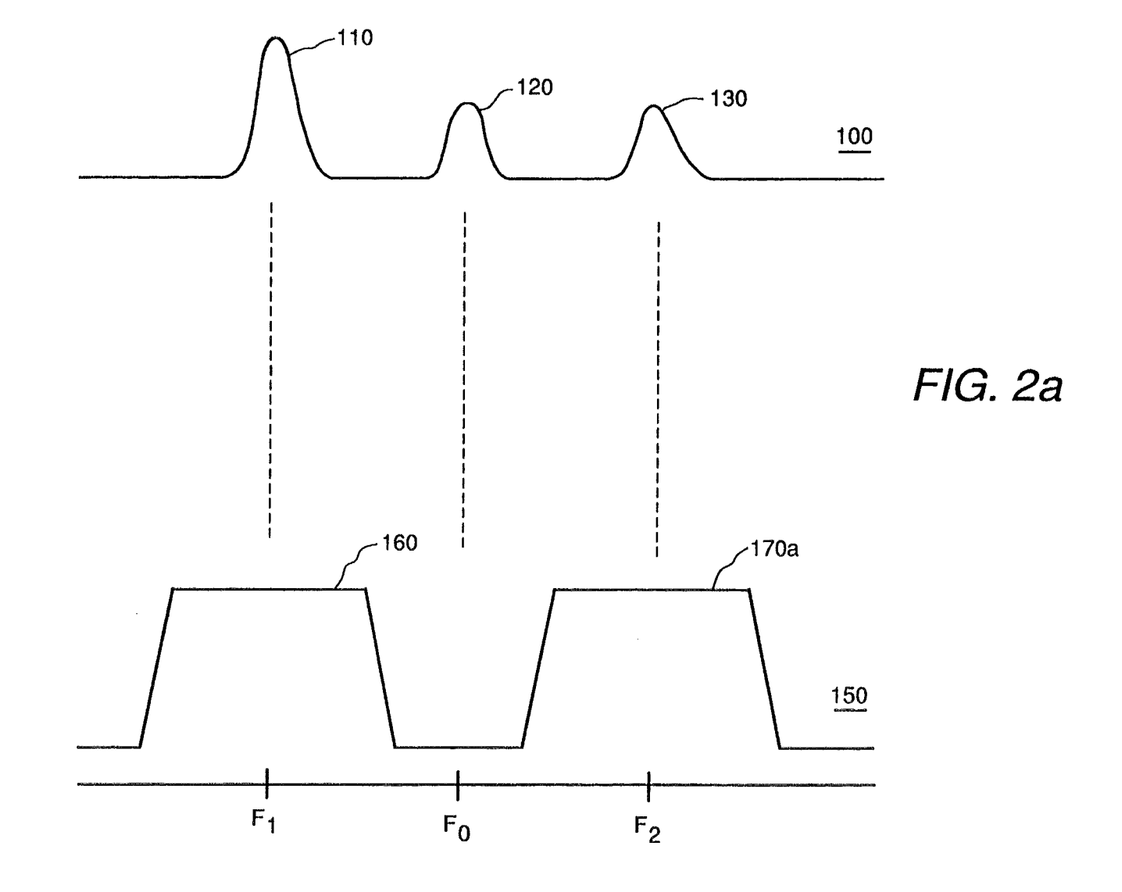
FIG. 2a is an MR spectrum having three spectral peaks, one pertaining to each of three chemical species, and an RF excitation pulse spectrum according to the present invention having two bands for selectively exciting two of the chemical species.

In FIG. 2a, an MR spectrum 100 obtained from the subject is shown. This spectrum is comprised of a first spectral peak 110, a second spectral peak 120 and a third spectral peak 130. These peaks arise from different populations of nuclear spins found in the subject. For purposes of illustration, it is assumed that each peak is one of the larger peaks of each chemical species and is characteristic of that chemical species and that the first spectral peak 110 arises from nuclear spins found in the water molecules of the subject, the second spectral peak 120 arises from nuclear spins found in the lipid molecules of the subject and the third spectral peak 130 arises from nuclear spins found in a silicone gel implant placed within the subject. In principle, each distinct population of nuclear spins having unique chemical shifts will result in a spectral peak in the chemical shift NMR spectrum.

FIG. 2a also contains an RF excitation spectrum 150 having a double excitation band. RF excitation spectrum 150 has a first excitation band 160 positioned at a frequency $F_1$ substantially at the same frequency as first spectral peak 110. Second excitation band 170a is placed at a frequency $F_2$ substantially at the same frequency as third spectral peak 130. RF excitation spectrum 150 does not have an excitation band at frequency $F_0$ substantially at the same frequency as second spectral peak 120. Note that the number of bands is arbitrary. The bandwidth must include the spectral peak of the chemical species desired to be imaged, and the amplitude is defined by basic MR principles for the type of imaging desired.

Multiple band RF excitation pulses can be generated by combining linear combinations of single band RF excitation pulses. Prior to linear combination each single band RF pulse is frequency modulated by a selected offset, phase modulated by a selected phase shift and scaled by a selected amplitude. The profile of each band in the multi-band excitation spectrum can be determined in a manner well known to those skilled in the art of MR RF pulse design. For example, a truncated sin(x)/x pulse envelope gives a band profile which approximates that of an ideal rectangular band. In general longer duration RF pulses result in narrower bands, whereas a larger member of lobes in the sin(x)/x waveform results in a sharper band edge.

Figure 2B:
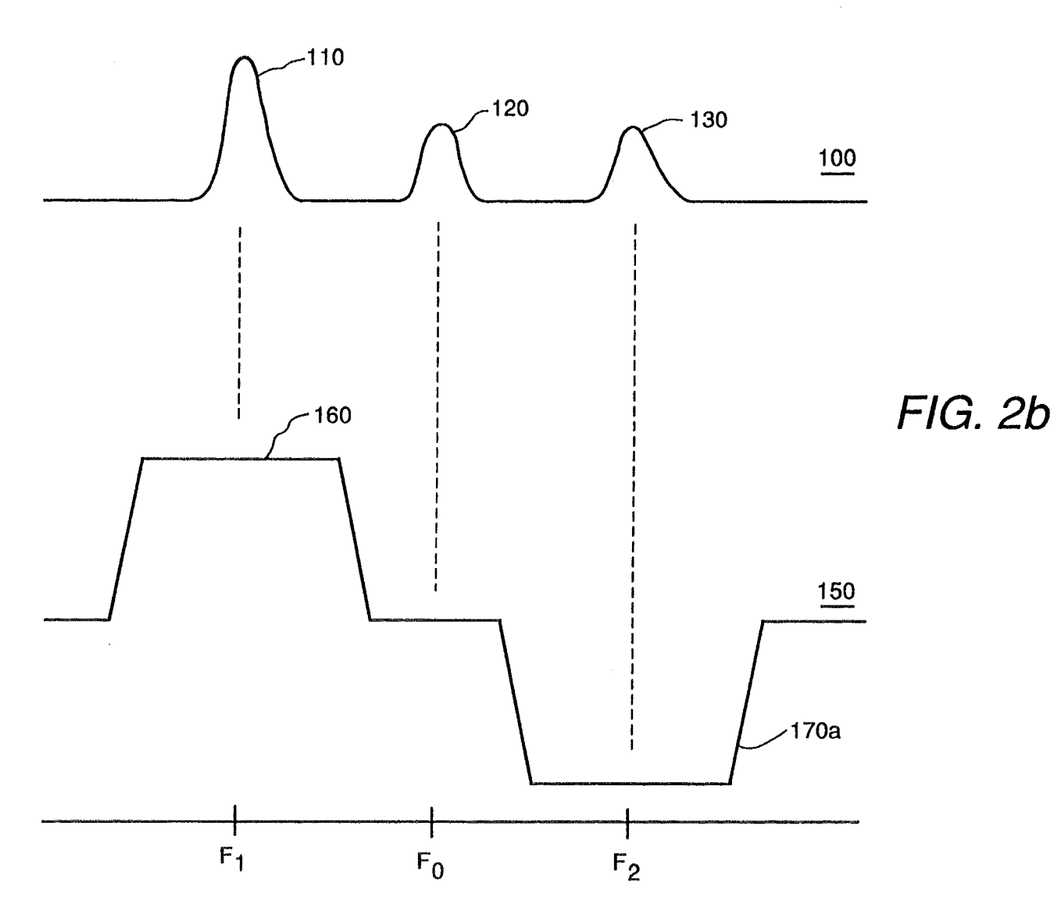
FIG. 2b is the MR spectrum of FIG. 2a, and an RF excitation pulse spectrum of the present invention having one of the bands shifted by 180°.

In order to separate the MR response signals, after position encoding with magnetic field gradients, it should be noted that by applying a multi-band RF excitation pulse, followed by the next imaging repetition with an RF excitation pulse with one of the excitation bands having a 180° phase shift in the time domain which is an opposite polarity in the frequency domain, 170b as shown in FIG. 2b, MR response signals from each spectral peak can be differentiated by their response to changes in RF excitation spectrum 150 since each spectral peak is excited by an independent band. In the present invention, the phase of each excitation band is used to encode the band identity in the detected signals from each population of nuclear spins. For example, MR response signals can be acquired with the following phase cycling sequence:

|  | Phase of first band | Phase of second band |
| --- | --- | --- |
| Excitation 1 | 0° | 0° |
| Excitation 2 | 0° | 180° |

In this sequence, MR response signals are acquired responsive to two RF excitations. In the first excitation both bands have identical phase. In the second excitation, the bands are 180° out of phase with respect to each other. Consequently, signals which are excited by the first band can be selectively detected by adding the data acquired responsive to the first and second excitations. Signals excited by the second band can be selectively detected by computing the difference of the data acquired responsive to the first and second excitations. Note that in this phase cycling sequence all aspects of the MR imaging pulse sequence are identical for the first and second excitation except for the phase of the second band. Consequently, this phase sequence requires an even Number of Excitations (NEX) equal to at least two.

With the phase cycling sequence described above, selective images of the different components are generated. An alternative embodiment employs a more complicated phase cycling scheme (which be referred to as "Phase Multiplexing") in which the phase of each excitation band is incremented by a selected amount for each increment of the imaging sequence's phase encoding gradient pulse. For example:

|  | Phase of first band | Phase of second band |
| --- | --- | --- |
| Excitation 1 | 0° | 0° |
| Excitation 2 | 90° | −90° |
| Excitation 3 | 180° | −180° |
| Excitation 4 | 270° | −270° |

Unlike the first phase cycling program, each excitation in this program is performed with a different amplitude of a phase encoding gradient pulse as well as a different phase shift for each RF excitation band. Consequently, the minimum NEX for each point in the collected data set is one.

With this phase cycling scheme, signals which are excited by the first band appear in the phase encoding dimension in a position which is the sum of the physical displacement of the MR response signal source and $\frac{1}{4}$ the field-of-view. Signals which are excited by the second band, however, appear in a position which is the sum of the physical displacement and $-\frac{1}{4}$ the field-of-view. Note that the displacement caused by incrementing the phase of the RF excitation bands is determined by the phase increment between repetitions and any desired offset of any band can be accomplished by selecting the proper phase increment.

Figure 3A:
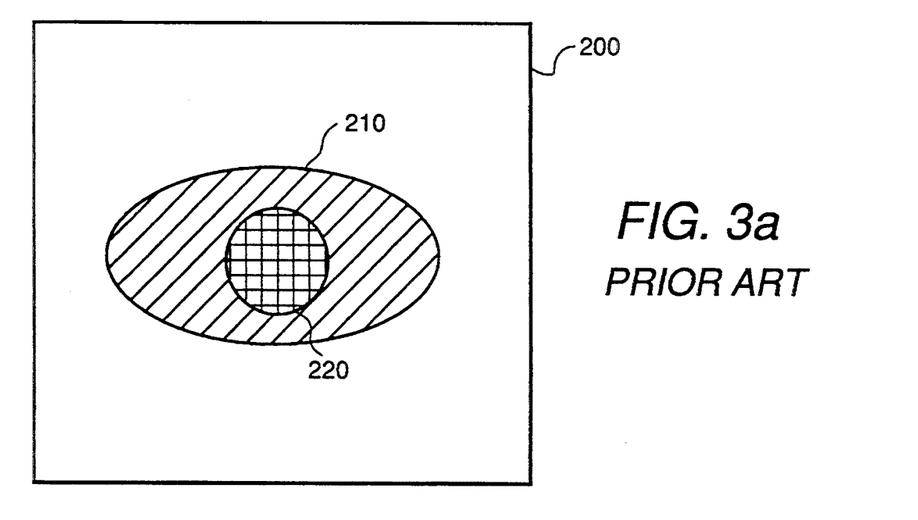
FIG. 3a is a representation of a conventional cross-sectional MR image of an object having two chemical species.

FIG. 3a is a conventional MR image 200 in with two objects containing different chemical species. For the purpose of illustration, a first object 210 contains water molecules which produce first spectral peak 110 of FIG. 2a and a second object 220 contains silicone molecules which produce third spectral peak 130 of FIG. 2a. Note that in conventional MR images each object is represented in the image in a location which is commensurate with its actual physical position. This is because conventional MR imaging procedures employ RF excitation pulses which are non-selective for different chemical species.

Figure 3B:
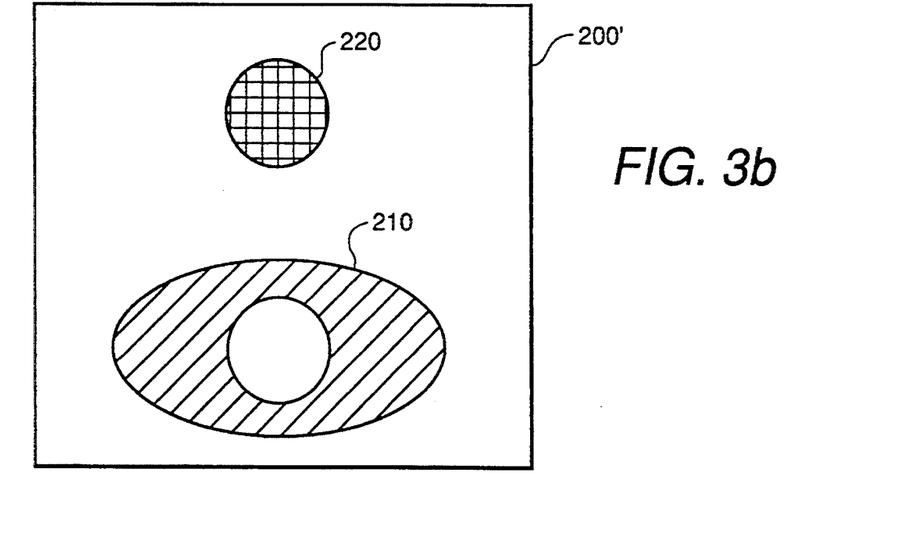
FIG. 3b is a representation of a cross-sectional MR image of an object having two chemical species which have been displaced in opposite directions according to the present invention.

FIG. 3b shows a representation of a multiple-band excited MR image 200' of the first and second objects 210, 220 obtained with the Phase Multiplexing embodiment of the present invention. The first and second objects are excited by different RF excitation bands. The phase of each band excitation is incremented as described in the second phase cycling program to cause signals from first object 210 to be displaced downward by $\frac{1}{4}$ the field-of-view and signals from second object 220 to be displaced upward by $\frac{1}{4}$ the field-of-view.

Figure 4:
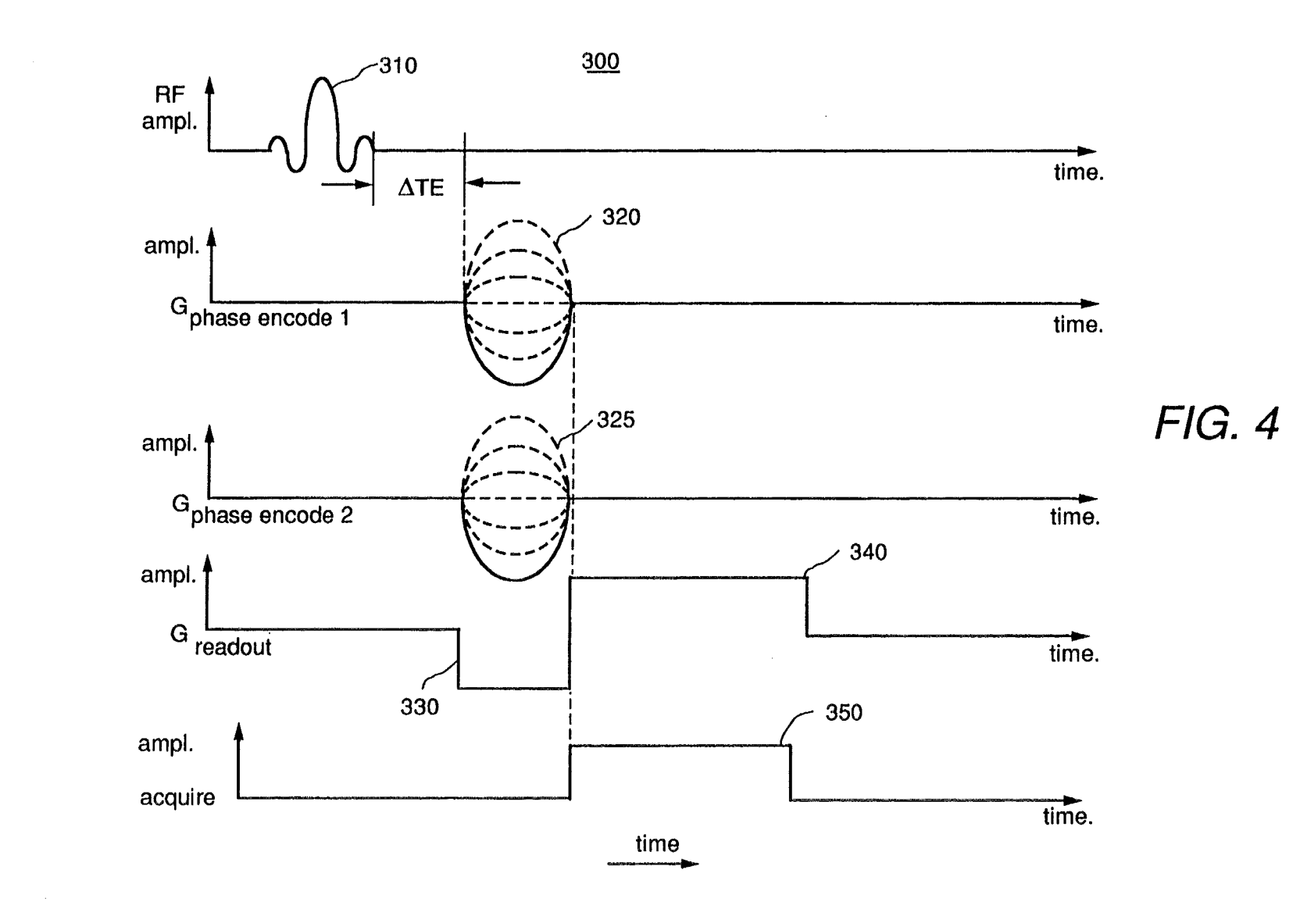
FIG. 4 is an MR imaging pulse sequence diagram of a gradient recalled embodiment of the present invention.

FIG. 4 is a representation of an MR imaging gradient recalled pulse sequence 300 used in driving the RF coils and the magnetic gradient coils of a magnetic resonance imaging system in accordance with the present invention. This embodiment includes a multi-band RF excitation pulse 310. This RF excitation pulse is applied with sufficient power and at an appropriate frequency to cause the magnetization of selected spin populations within the subject to be nutated into the transverse plane in a fashion well know to those skilled in the art. Note that the representation of RF excitation pulse 310 in FIG. 4 includes only the magnitude of a sin(x)/x RF pulse and does not reflect frequency modulation used to offset the excitation bands. Unlike RE excitation pulses in conventional MR imaging pulse sequences, RF pulse 310 is applied during a period of substantially no magnetic field gradient activity. This makes RF excitation pulse 310 non-spatially selective exciting resonance in the entire imaging volume for chemical species corresponding to the RF excitation bands. Because it is a multi-band pulse, however, it has a frequency response spectrum similar to that shown in FIGS. 2a and 2b. Following the application of RF excitation pulse 310 an echo delay $\Delta TE$ is applied. After the echo delay, a first phase-encoding magnetic field gradient pulse 320 and a second phase encoding magnetic field gradient pulse 325 are applied on a first magnetic field gradient and second magnetic field gradient axis respectively. Phase-encoding gradient pulses 320, 325 have selected amplitudes which vary during the scanning procedure. A readout dephasing magnetic field gradient pulse 330 is applied in a direction substantially orthogonal to both first phase-encoding pulse 320 and second phase-encoding pulse 325, after the end of RF pulse 310. It is desirable, although not necessary, to apply readout dephasing gradient pulse 330 substantially simultaneous with phase-encoding gradient pulses 320, 325. Readout dephasing gradient pulse 330 induces a phase shift in spin magnetization which is proportional to the position of the spin along the axis of the readout dephasing gradient. After the readout dephasing pulse is applied a readout magnetic field gradient pulse 340 is applied simultaneously with a data acquire signal 350. Readout gradient pulse 340 is applied with opposite polarity than readout dephasing pulse 330. Readout gradient pulse 340 is applied at a substantially uniform amplitude during the duration of data collect signal 350. Readout gradient pulse 340 changes the local magnetic field experienced by each nuclear spin within the subject so that each spin emits an MR response signal which is directly proportional to the spin position along the applied readout gradient axis. Since the resonant frequency of each spin is directly proportional to the magnetic field it experiences, a frequency analysis of MR response signal acquired using a Fourier Transformation permits the determination of the location of each spin.

Gradient recalled pulse sequence 300 is repeated a plurality N×M times, each repetition having a selected one of N amplitudes of first phase encoding gradient pulse 320 and a selected one of M amplitudes of second phase encoding gradient pulse 325. Each application of phase encoding pulses 320, 325 induces a phase shift in the acquired signal which is proportional to the position of the signal generating spin along the respective phase encoding axes. The amplitude of each phase encoding gradient pulse 320, 325 is incremented in a substantially uniform fashion. The size of this increment determines the field-of-view along the respective phase-encoding gradient axes. In accordance with the present invention, the phase of each band in RF excitation pulse 310 is also incremented in concert with the increment of a selected one of the phase encoding gradient pulses 320, 325. This further modulates the phase of each spin such that upon Fourier Transformation of the MR response signals which have already been Fourier transformed, the displacement of signal intensity in the image is the sum of an offset determined by the spin's position, and a displacement (along the phase encoding axis) determined by the phase increment of the RF excitation band which excited the spin.

Several modifications to the preferred embodiment of this invention are possible. For example, signal averaging can be accomplished by preforming the N×M repetitions of gradient recalled pulse sequence 300 a plurality J=1 to NEX times. The phase of RF excitation pulse 310 can be further modulated with respect to J to reduce image artifacts is a manner well known to those skilled in the art. In addition to modulating the phase of the RF excitation pulse, it is possible to modulate the delay between RF excitation pulse 310 and data acquire signal 350 so that differences in chemical shift can be detected as disclosed by Dixon.

In one embodiment of the present invention, the multi-band RF excitation pulse is applied so that the bands are offset with respect to the center frequency of the RF excitation pulse, NEX is chosen to be an even number and ΔTE is selected to be a predetermined value for odd values of J and minimal for even values of J. The non-minimal value of ΔTE is chosen according the relationship:

$$1\Delta TE_{even} = 2\Delta F$$

Where ΔF is the offset frequency of a selected spin resonance. Data is collected for even and odd values of J. The difference of the even and odd collected data is then computed. Signals which have a frequency offset equal to an odd multiple of ΔF combine constructively, whereas signals at an offset frequency equal to even multiples of ΔF combine destructively. The degree of suppression of undesired signal components at an offset frequency of zero is determined by the multiplicative combination of the suppression efficiency of the multi-band RF pulse and the suppression efficiency of the ΔTE modulation.

Figure 5:
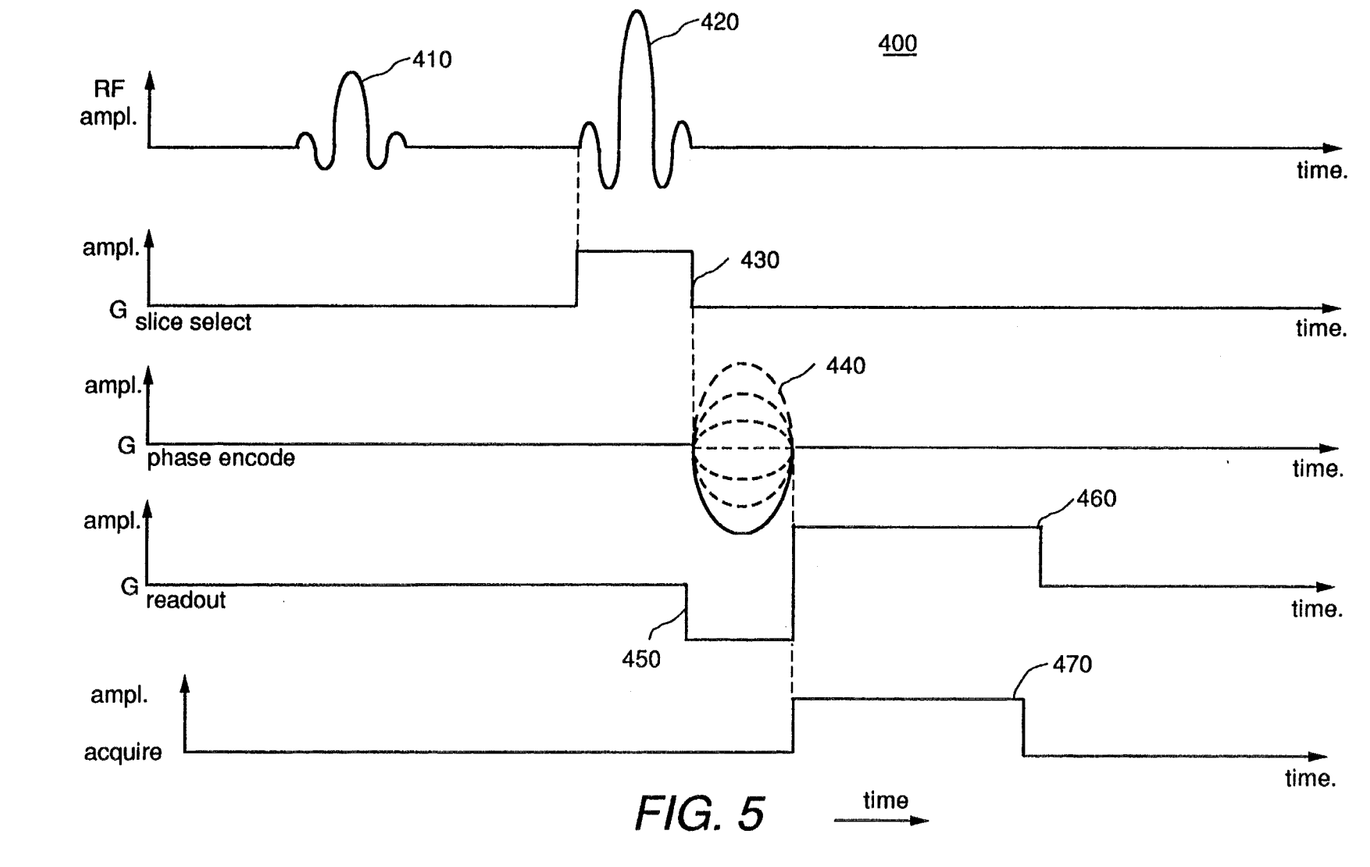
FIG. 5 is an MR imaging pulse sequence diagram of a spin-echo recalled embodiment of the present invention.

FIG. 5 shows an alternative embodiment of the present invention. Here a spin-echo MR pulse sequence 400 is shown. In this sequence an RF excitation pulse 410, substantially identical to RF excitation pulse 310 described in FIG. 4 is applied. After a suitable delay transverse spin magnetization is refocussed with a refocussing RF pulse 420 which is applied in the presence of a slice select magnetic field gradient pulse 430. Slice select gradient pulse 430 limits the spatial distribution of refocussed spin magnetization to a selected slab. Consequently, spin-echo pulse sequence 400 requires only a single phase-encoding magnetic field gradient axis to achieve localization in three orthogonal dimensions. A readout dephasing magnetic field gradient pulse 450 is applied substantially simultaneously with phase-encoding gradient pulse 440. After both phase-encoding pulse 440 and readout dephasing pulse 450, a readout magnetic field gradient pulse 460 is applied substantially simultaneously with a data acquire signal 470. Note that phase-encoding pulse 440, readout dephasing pulse 450, readout pulse 460 and data acquire signal 470 behave in substantially identical fashion as their counterparts in the MR imaging gradient recalled pulse sequence 300.

Spin-echo MR pulse sequence 400 is repeated N times, each repetition having a selected one of N amplitudes of phase encoding pulse 440. In accordance with the present invention, the phase of each band in RF excitation pulse 410 is also incremented in concert with the increment of phase-encoding gradient pulse 440. This further modulates the phase of each spin such that upon Fourier Transformation of the data, the displacement of signal intensity in the phase-encoding dimension is the sum of an offset determined by the spin's position and a displacement (along the phase encoding axis) determined by the phase increment of the band which excited the spin.

In alternative embodiments of the present invention, the N repetitions of spin-echo pulse sequence 400 can be performed J=1 to NEX times for purposes of signal averaging and to permit additional modulation of RF excitation phase shifts and/or delays between RF excitation pulse 410 and the acquisition of the MR response signals.

Figure 6:
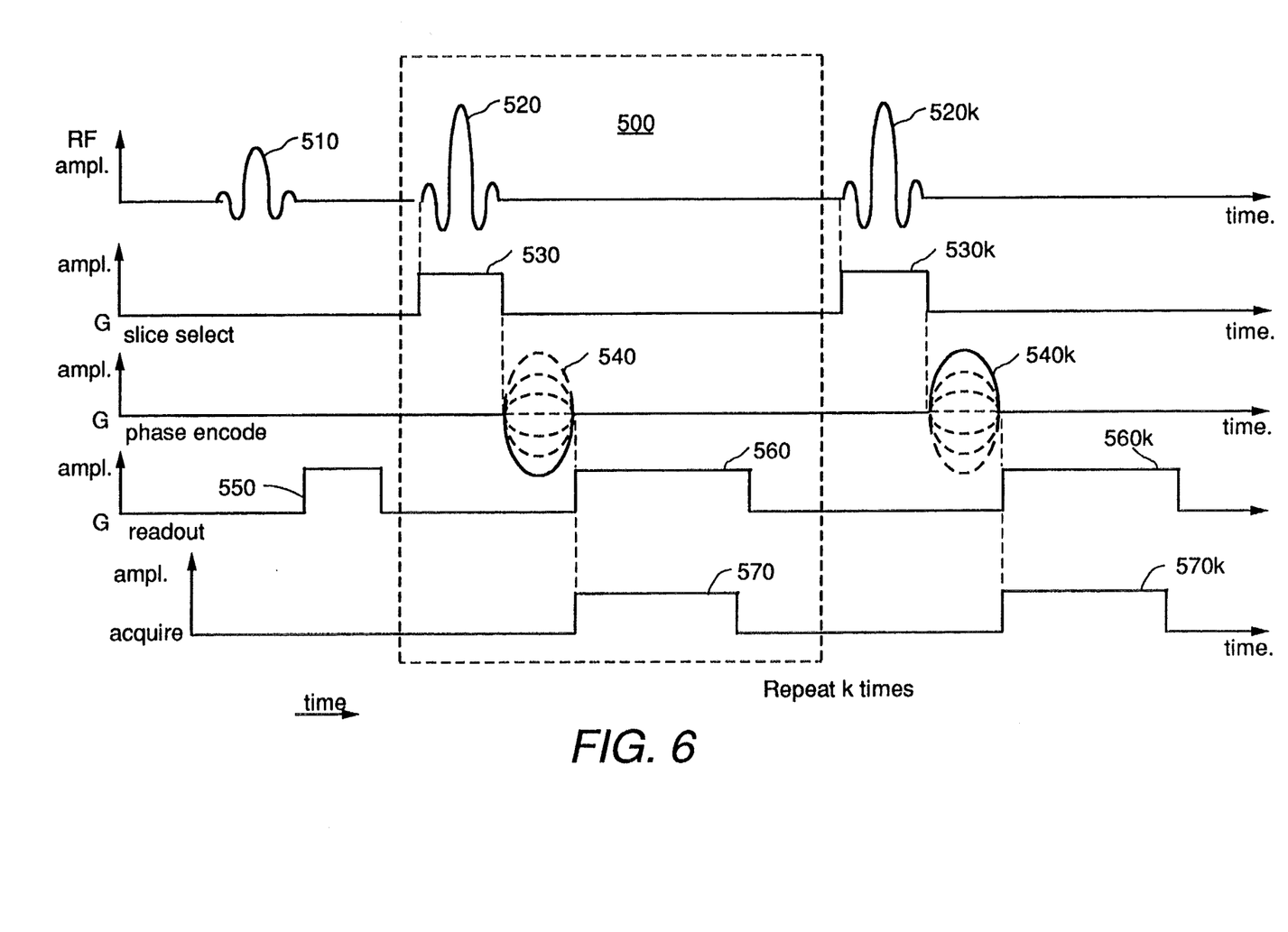
FIG. 6 is an MR imaging pulse sequence diagram of a multiple spin-echo embodiment of the present invention in which each echo is acquired responsive to a unique phase encoding pulse amplitude.

In FIG. 6, a fast spin-echo pulse sequence 500 is shown. As with MR imaging gradient recalled MR pulse sequence 300 and spin-echo recalled pulse sequence 400, a multi-band RF excitation pulse 510 is applied to selectively excite selected spectral bands within the NMR spectrum of the subject. Afar RF excitation pulse 510 is applied, a readout dephasing magnetic filed gradient pulse 550 is applied. After a suitable delay transverse spin magnetization is refocussed with a refocussing RF pulse 520 which is applied in the presence of a slice select magnetic field gradient pulse 530. Slice select gradient pulse 530 limits the spatial distribution of refocussed spin magnetization to a selected slab. Consequently, spin-echo pulse sequence 500 requires only a single phase-encoding magnetic field gradient axis to achieve localization in three orthogonal dimensions. Afar phase-encoding pulse 540, a readout magnetic field gradient pulse 560 is applied substantially simultaneously with a data acquire signal 570. Note that phase-encoding pulse 540, readout dephasing pulse 550, readout pulse 560 and data acquire signal 570 behave in substantially identical fashion as their counterparts in MR imaging gradient recalled pulse sequence 300.

The application of refocussing RF 520, slice select gradient pulse 530, readout gradient pulse 560 and data collect signal 570 is repeated a plurality k times. For the purpose of illustration, FIG. 6 shows fast spin-echo pulse sequence 500 having k=2. In general, however, k can have any whole number value greater than one. Refocussing RF pulse 520$k$ is substantially identical to refocussing RF pulse 520. Likewise, slice select gradient pulse 530$k$ is substantially identical to slice select gradient pulse 530. Also, readout gradient pulse 560$k$ is substantially identical to readout gradient pulse 560, and data acquire signal 570$k$ is substantially identical to data acquire signal 570. Phase-encoding gradient pulse 540$k$, however, is selected to have an amplitude which will induce a selected phase shift in the acquired MR response signal which is proportional to the position of the signal generating spin along the phase-encoding gradient axis.

Fast spin-echo pulse sequence 500 is applied a plurality L=N/k times where N is the total number of phase encoding steps used to encode position along the phase encoding axis. N is also the total number of times readout gradient 560 and data collect signal 570 are applied. The amplitude of phase-encoding gradient pulses 540, 540$k$ are chosen for each repetition of fast spin-echo pulse sequence 500 such that each of the N sets of data are acquired responsive to a unique value of the phase-encoding phase shift. As in MR imaging gradient recalled pulse sequence 300 and spin-echo MR pulse sequence 400 the phase of each band in multi-band RF excitation pulse 510 is selected to cause different chemical shift components within the subject to appear in different parts of the final image. Since RF excitation pulse 510 is only applied once for each group of k data sets, the selection of a phase increment program which causes selected chemical shift components of the subject to be translated in the image is constrained such that k is a multiple of number of steps in the phase cycling sequence.

In alternative embodiments of fast spin-echo pulse sequence 500, the L repetitions of spin-echo pulse sequence 500 can be performed J=1 to NEX times for purposes of signal averaging and to permit additional modulation of RF excitation pulse phase shifts and/or delays between RF excitation pulse 510 and the acquisition of MR response signals.

Selective detection of spectroscopic components in the subject can be enhanced by incorporating saturation RF pulses in any embodiment of the present invention. These saturation pulses can be either spatially selective (attenuating all signals from a selected region of the subject) or they can be chemical shift selective (attenuating one or more selected spectral peaks). Chemical shift selective saturation of selected spectral peaks can also be accomplished by increasing the amplitude of the corresponding excitation bands within the multi-band RF excitation pulse.

Several steps may be taken with all embodiment of the present invention to enhance the appearance and utility of the resulting MR images. For example, portions of images corresponding to only a selected chemical shift component can be extracted to provide chemical species selective images (e.g. water only image). In addition, misregistration artifacts caused by chemical shift phenomena can be corrected by applying appropriate translations to the component images prior to combination into a complete MR image. Display of image components in a combined image can be performed by the inclusion of color display methods to highlight selected components.

While several presently preferred embodiments of the novel multiple component spectroscopic imaging method have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for obtaining a magnetic resonance (MR) image of a plurality of chemical species of a subject, comprising the steps of:
   a) placing a subject in a substantially homogeneous magnetic field;
   b) applying a multi-band radio-frequency (RF) pulse having a plurality of bands of selected amplitudes at frequencies which correspond to resonant frequency peaks of chemical species desired to be imaged to said subject, each band having a phase $\phi$;
   c) applying a phase-encoding magnetic field gradient pulse in a phase encoding direction of an amplitude A to said subject;
   d) applying a readout magnetic field gradient pulse in a readout direction to said subject;
   e) collecting an MR response signal from said subject simultaneously with the application of the readout magnetic field gradient pulse;
   f) calculating the Fourier transform of the collected MR response signal with respect to the readout direction to create a processed data set for amplitude A;
   g) repeating steps 'b' 'through' f for N repetitions, each with a unique phase encoding magnetic field gradient amplitude A, and a unique phase offset $\phi$ for at least one band of the multi-band RF pulse; and
   h) calculating the Fourier transform of the processed data sets with respect to the phase encoding direction to create an MR image of the desired chemical species.

2. A method for obtaining magnetic resonance (MR) images of a plurality of chemical species of a subject, comprising the steps of:
   a) placing a subject in a substantially homogeneous magnetic field;
   b) applying a multi-band radio-frequency (RF) pulse having a plurality of bands of selected amplitudes at frequencies which correspond to resonant frequency peaks of chemical species desired to be imaged to said subject, each band having a phase $\phi$;

c) applying a first phase-encoding magnetic field gradient pulse in a phase encoding direction of an amplitude $A_1$ to said subject;

d) applying a second phase-encoding magnetic field gradient pulse in a please encoding direction of an amplitude $A_2$ to said subject;

e) applying a readout magnetic field gradient pulse in a readout direction to said subject;

f) collecting an MR response signal after a time delay TE after the application of the multi-band RF pulse from said subject simultaneously with the application of the readout magnetic field gradient pulse;

g) calculating the Fourier transform of the collected MR response signal with respect to the readout direction to create a processed data set for amplitude $A_1$;

h) repeating steps 'b' through 'g' for N repetitions, each with a unique phase encoding magnetic field gradient amplitude $A_1$, and a unique phase offset $\phi$ for at least one band of the multi-band RF pulse; and i) calculating the Fourier transform of the processed data sets with respect to the first phase encoding direction to create a second processed data set j) repeating steps 'b' through 'i' for M repetitions, each with a unique phase encoding magnetic field gradient amplitude $A_2$, and a unique phase offset $\phi$ for at least one band of the multi-band RF pulse; and k) calculating the Fourier transform of the second processed data sets with respect to the second phase encoding direction to create M MR images of the desired chemical species.

3. The method of claim 2 in which the phase of selected bands in said multi-band radio-frequency pulse is incremented by a selected amount for each of the N repetitions to result in an image of a plurality of chemical species with each chemical species appearing in a different region of the image.

4. A method for obtaining magnetic resonance (MR) images of a selected chemical species of a subject, comprising the steps of:

a) placing a subject in a substantially homogeneous magnetic field;

b) applying a multi-band radio-frequency (RF) pulse having a plurality of bands of selected amplitudes at frequencies which correspond to resonant frequency peaks of chemical species desired to be imaged to said subject, each band having a phase $\phi$;

c) applying a first phase-encoding magnetic field gradient pulse in a phase encoding direction of an amplitude $A_1$ to said subject;

d) applying a second phase-encoding magnetic field gradient pulse in a phase encoding direction of an amplitude $A_2$ to said subject;

e) applying a readout magnetic field gradient pulse in a readout direction to said subject;

f) collecting an MR response signal from said subject simultaneously with the application of the readout magnetic field gradient pulse;

g) calculating the Fourier transform of the collected MR response signal with respect to the readout direction to create a processed data set for amplitude $A_1$;

h), repeating steps 'b' through 'g' for N repetitions, each with a unique phase encoding magnetic field gradient amplitude $A_1$, and a unique phase offset $\phi$ for at least one band of the multi-band RF pulse; and i) calculating the Fourier transform of the processed data sets with respect to the first phase encoding direction to create a second processed data set j) repeating steps 'b' through 'i' for M repetitions, each with a unique phase encoding magnetic field gradient amplitude $A_2$, and a unique phase offset $\phi$ for at least one band of the multi-band RF pulse;

k) calculating the Fourier transform of the second processed data sets with respect to the second phase encoding direction to create a first set of M MR images of chemical species;

l) repeating steps 'b'-'k' with a selected phase offset $\phi + \pi$ to create a second set of M MR images of chemical species;

m) computing the difference between corresponding images from the first and second sets of MR images to obtain a third set of MR images having only information from one selected chemical species.

5. A method for obtaining magnetic resonance (MR) images of a selected chemical species of a subject, comprising the steps of:

a) placing a subject in a substantially homogeneous magnetic field;

b) applying a multi-band radio-frequency (RF) pulse having a plurality of bands of selected amplitudes at frequencies which correspond to resonant frequency peaks of chemical species desired to be imaged to said subject, each band having a phase $\phi$;

c) applying a first phase-encoding magnetic field gradient pulse in a phase encoding direction of an amplitude $A_1$ to said subject;

d) applying a second phase-encoding magnetic field gradient pulse in a phase encoding direction of an amplitude $A_2$ to said subject;

e) applying a readout magnetic field gradient pulse in a readout direction to said subject;

f) collecting an MR response signal from said subject simultaneously with the application of the readout magnetic field gradient pulse;

g) calculating the Fourier transform of the collected MR response signal with respect to the readout direction to create a processed data set for amplitude $A_1$;

h) repeating steps 'b' through 'g' for N repetitions, each with a unique phase encoding magnetic field gradient amplitude $A_1$, and a unique phase offset $\phi$ for all least one band of the multi-band RF pulse; and i) calculating the Fourier transform of the processed data sets with respect to the first phase encoding direction to create a second processed data set j) repeating steps 'b' through 'i' for M repetitions, each with a unique phase encoding magnetic field gradient amplitude $A_2$, and a unique phase offset $\phi$ for at least one band of the multi-band RF pulse;

k) calculating the Fourier transform of the second processed data sets with respect to the second phase encoding direction to create a first set of M MR images of chemical species;

l) repeating steps 'b'-'k' with a selected time delay $TE + \Delta TE$, where $\Delta TE$ is chosen to produce a $\phi$ phase shift in the MR response signal of said selected chemical species, to create a second set of M MR images of chemical species;

m) computing the difference between corresponding images from the first and second sets of MR images to obtain a third set of MR images having only information from one selected chemical species.

* * * * *